United States Patent
Eggert

(10) Patent No.: US 11,275,162 B2
(45) Date of Patent: Mar. 15, 2022

(54) METHOD FOR RADIO MEASURING APPLICATIONS

(71) Applicant: METIRIONIC GMBH, Dresden (DE)

(72) Inventor: Dietmar Eggert, Dresden (DE)

(73) Assignee: Metirionic GmbH, Dresden (DE)

( * ) Notice: Subject to any disclaimer, the term of this patent is extended or adjusted under 35 U.S.C. 154(b) by 254 days.

(21) Appl. No.: 16/820,201

(22) Filed: Mar. 16, 2020

(65) Prior Publication Data
US 2020/0249335 A1 Aug. 6, 2020

Related U.S. Application Data

(63) Continuation of application No. PCT/EP2018/000434, filed on Sep. 17, 2018.
(Continued)

(30) Foreign Application Priority Data

Sep. 15, 2017 (DE) ...................... 10 2017 008 647.8

(51) Int. Cl.
*G01S 11/02* (2010.01)
*H04B 17/27* (2015.01)
(Continued)

(52) U.S. Cl.
CPC .......... *G01S 11/02* (2013.01); *G01R 29/0871* (2013.01); *G01R 29/0892* (2013.01);
(Continued)

(58) Field of Classification Search
CPC ...... G01S 11/02; G01S 13/765; G01S 13/767; G01S 2013/462; G01R 29/0871;
(Continued)

(56) References Cited

U.S. PATENT DOCUMENTS 3,243,812 A 3/1966 Williams
7,061,369 B2 * 6/2006 Bergerhoff .............. B60R 25/20
340/5.61
(Continued)

FOREIGN PATENT DOCUMENTS

DE 10 2009 060 505 A1 7/2010
DE 10 2009 060 591 A1 7/2010
(Continued)

OTHER PUBLICATIONS

Rick Roberts, "TDOA Localization Techniques," IEEE 802.15-04a/572r10, Presentation, pp. 1-11 (Oct. 4, 2004).
U.S. Appl. No. 16/820,211, filed Mar. 16, 2020.
U.S. Appl. No. 16/820,228, filed Mar. 16, 2020.

*Primary Examiner* — Ankur Jain
(74) *Attorney, Agent, or Firm* — Muncy, Geissler, Olds & Lowe, P.C.

(57) ABSTRACT

A method for radio measuring applications, wherein a first radio node functions as an initiator and a second radio node as a transponder, each radio node has its own timer and a data interface, in a first step, the initiator transmits a first carrier frequency as an initial signal and the initial signal is received by the transponder during a first reception period, in a second step, a response signal with a second carrier frequency is transmitted by the transponder and the response signal is received by the initiator during a second reception period. The initial signal and the response signal are coherent at least during each sequence of steps, the carrier frequency of the initial signal is changed within one predetermined frequency domain with each repetition.

11 Claims, 10 Drawing Sheets

Related U.S. Application Data

(60) Provisional application No. 62/559,116, filed on Sep. 15, 2017.

(51) Int. Cl.
*H04B 17/30* (2015.01)
*G01R 29/08* (2006.01)
*G01S 13/76* (2006.01)
*H04W 24/08* (2009.01)
*G01S 13/46* (2006.01)

(52) U.S. Cl.
CPC .......... *G01S 13/765* (2013.01); *G01S 13/767* (2013.01); *H04B 17/27* (2015.01); *H04B 17/30* (2015.01); *H04W 24/08* (2013.01); *G01S 2013/462* (2013.01)

(58) Field of Classification Search
CPC .... G01R 29/0892; H04B 17/27; H04B 17/30; H04W 24/08; H04W 24/00
See application file for complete search history.

(56) References Cited

U.S. PATENT DOCUMENTS

| | | | | |
|---|---|---|---|---|
| 8,405,543 | B2 * | 3/2013 | Kluge | G01S 13/84 |
| | | | | 342/125 |
| 8,406,144 | B2 * | 3/2013 | Sachse | G01S 13/84 |
| | | | | 370/252 |
| 8,644,768 | B2 * | 2/2014 | Kluge | G01S 11/02 |
| | | | | 455/67.16 |
| 10,466,350 | B2 * | 11/2019 | Kluge | H04W 64/006 |
| 2009/0149198 | A1 * | 6/2009 | Nam | G01S 5/0294 |
| | | | | 455/456.2 |
| 2010/0074133 | A1 * | 3/2010 | Kim | G01S 5/0289 |
| | | | | 370/252 |

FOREIGN PATENT DOCUMENTS

| | | |
|---|---|---|
| DE | 10 2009 060 593 A1 | 7/2010 |
| DE | 10 2009 060 592 B4 | 6/2012 |
| EP | 2 244 098 A1 | 10/2010 |
| EP | 3 067 712 A1 | 9/2016 |
| WO | WO 02/01247 A1 | 1/2002 |
| WO | WO 2005/119379 A1 | 12/2005 |

* cited by examiner

| Initiator TX BB Vector $V_I$ | Initiator TX HF Signal $T_I$ | Transponder RX BB Vector $R_T$ | Transponder TX BB Vector $V_T$ | Transponder TX HF Signal $T_T$ | Initiator RX BB Vector $R_I$ |
|---|---|---|---|---|---|
| | Schritt S1 | | | Schritt S2 | |
| 1 | $e^{j\omega_p t}$ | $G(j\omega_p) \cdot e^{j(\omega_p \cdot T'_{offs} - \Delta\varphi)}$ | 1 | $e^{j(\omega_p \cdot (t - T'_{offs} - T_{SV}) + \Delta\varphi)}$ | $G(j\omega_p) \cdot e^{-j(\omega_1 \cdot T'_{offs} - \Delta\varphi)}$ |
| | | | $V_T = R_T$ $= G(j\omega_p) \cdot e^{-j(\omega_p \cdot T'_{offs} - \Delta\varphi)}$ | $G(j\omega_p) \cdot e^{j\omega_p \cdot (t - T_{SV})}$ | $G(j\omega_p) \cdot G(j\omega_p) =$ $mag^2(G(j\omega_p)) \cdot e^{j \cdot 2 \cdot phase(G(j\omega_p))}$ |
| | | | $V_T = 1/R_T$ $= 1/G(j\omega_p) \cdot e^{-j(\omega_p \cdot T'_{offs} - \Delta\varphi)}$ | $1/G(j\omega_p) \cdot e^{j\omega_p \cdot (t - 2 \cdot T'_{offs} - T_{SV})} \cdot e^{2 \cdot j\Delta\varphi}$ | $e^{-j \cdot 2 \cdot (\omega_p \cdot T'_{offs} - \Delta\varphi)}$ |
| | | | $V_T = conj(R_T)$ $= G^*(j\omega_p) \cdot e^{-j(\omega_p \cdot T'_{offs} - \Delta\varphi)}$ | $G^*(j\omega_p) \cdot e^{j\omega_p \cdot (t - 2 \cdot T'_{offs} - T_{SV})} \cdot e^{2 \cdot j\Delta\varphi}$ | $mag^2(G(j\omega_p)) \cdot e^{-j \cdot 2 \cdot (\omega_p \cdot T'_{offs} - \Delta\varphi)}$ |
| | | | $V_T = e^{j \cdot phase(R_T)}$ $= e^{j \cdot phase(G(j\omega_p))} \cdot e^{j(\omega_p \cdot T'_{offs} - \Delta\varphi)}$ | $e^{j \cdot phase(G(j\omega_p))} \cdot e^{j\omega_p \cdot (t - T_{SV})}$ | $mag(G(j\omega_p)) \cdot e^{j \cdot 2 \cdot phase(G(j\omega_p))} \cdot e^{-j \cdot 2 \cdot \omega_p \cdot T'_{offs}}$ |
| | | | $V_T = e^{-j \cdot phase(R_T)}$ $= e^{-j \cdot phase(G(j\omega_p))} \cdot e^{-j(\omega_p \cdot T'_{offs} - \Delta\varphi)}$ | $e^{-j \cdot phase(G(j\omega_p))} \cdot e^{j\omega_p \cdot (t - 2 \cdot T'_{offs} - T_{SV})} \cdot e^{2 \cdot j\Delta\varphi}$ | $mag(G(j\omega_p)) \cdot e^{-j \cdot 2 \cdot (\omega_p \cdot T'_{offs} - \Delta\varphi)}$ |

Fig. 3

METHOD FOR RADIO MEASURING APPLICATIONS

This nonprovisional application is a continuation of International Application No. PCT/EP2018/000434, which was filed on Sep. 17, 2018, and which claims priority to German Patent Application No. 10 2017 008 647.8, which was filed in Germany on Sep. 15, 2017, and to U.S. Provisional Application No. 62/559,116, which was filed on Sep. 15, 2017, and which are all herein incorporated by reference.

BACKGROUND OF THE INVENTION

Field of the Invention

The present invention relates to a method for radio measuring applications, having at least two radio nodes for determining a transfer function and/or a time offset between the radio nodes.

Description of the Background Art

There are a variety of methods for determining the distance based on the measurement of phases and phase differences of reference signals in the frequency domain. The basic principle has been known for more than 50 years, for example from U.S. Pat. No. 3,243,812. The method has been used in various applications for decades. In addition to a large number of publications, there are also a number of patents.

DE 10 2009 060 505 B4 describes a method for communication between two radio nodes, wherein the radio nodes mutually transmit and receive signals and the carrier frequencies of the signals are changed for each repetition. The phase values extracted from the second radio node are subsequently transmitted back to the first radio node and then evaluated together with the received signals of the first radio node to determine a distance between the two radio nodes.

DE 10 2009 060 593 A1 discloses a further method for measuring the distance between two radio nodes, wherein the radio nodes exchange unmodulated carrier signals, each radio node identifies two phase values for two frequencies, and the distance between the radio nodes is determined from the total of four phase values.

Alternative methods for distance measurement between two radio nodes are known from DE 10 2009 060 592 B4 and DE 10 2009 060 591 A1.

From WO 2005/119379 A1, a method for the correction of jitter is known, wherein a first radio node receives a response signal to a transmitted initial signal from a second radio node and the response signal itself contains both the reception time of the initial signal determined by the second radio node and the transmission time of the response signal.

SUMMARY OF THE INVENTION

It is therefore an object of the present invention to provide a device which further develops the prior art.

According to an exemplary embodiment of the invention, a method for radio measuring applications is proposed, wherein at least two radio nodes are provided.

At least a first radio node operates as an initiator and at least a second radio node operates as a transponder.

The first radio node and the second radio node each comprise a timer and a data interface.

There is a time offset between the timers of the first radio node and those of the second radio node.

In a first step, a first carrier frequency is transmitted by the initiator and the initial signal is received by the transponder during a first reception period.

In a second step, a response signal with a second carrier frequency is transmitted by the transponder and the response signal is received by the initiator during a second reception period.

A step sequence from the first step and the second step in the mentioned order is repeated at least once, wherein the initial signal and the response signal are coherent at least during each step sequence.

The carrier frequency of the initial signal and the carrier frequency of the response signal are changed with each repetition within a predetermined frequency domain.

The method comprises a first mode and a second mode.

In the first mode, the response signal is formed at least from a portion of the received initial signal, and a transfer function and/or the time offset are determined based on at least one portion of the received response signals.

In the second mode, the response signal is formed independently from the received initial signal and at least two received initial signals are transmitted by means of the data interface and at least one transfer function and/or the time offsets are determined based on at least one portion of the received response signals and at least one portion of the received and transmitted initial signals.

It is understood that each radio node comprises a receiving unit, a transmitting unit, a signal processor, a data interface and at least one antenna. Furthermore, it is understood that in one step, only one radio node transmits at a time.

It should be noted that the terms time base and time domain are used interchangeably.

If a radio node comprises several antennas, the initial signal and/or the response signal is transmitted by one of the antennas or the initial signal and/or the response signal is emitted by several antennas. For example, the antennas radiate sequentially in succession during a transmission period. To this end, the transmission period is, e.g., divided into several time windows, wherein in each case one of the antennas transmits during a time window. It goes without saying that the reception of the signals can also be organized accordingly.

All of the values or signal vectors transferred with the inventive method can be manipulated by suitable encryption mechanisms to protect the running processes accordingly. For example, each signal vector can be assigned a time-varying number sequence that is known a priori to only the initiator and the transponder.

The data interface can be configured wired or wirelessly and enables the exchange of data, e.g., of determined signal vectors as well as the rough synchronization of the radio nodes.

An initiator is a radio node that transmits a signal in a first step.

A transponder is a radio node which receives and processes the signal transmitted in a first step. Only in a second step does the transponder transmit back a response signal.

By means of the method, a time offset between the individual timers and/or a transfer function can be determined. A prerequisite is that there is coherence between the signals of the first step and the signals of the second step.

The transfer function represents the transmission properties between two radio nodes in the frequency domain, i.e., the transmission of a signal via a propagation medium, and is the term used in the field of wireless data transmission. In many cases, the transfer function is also called the system function.

The recorded values can be transformed from the frequency domain to the time domain by means of a Fourier transform. In the time domain, the term channel impulse response is also usual for the transmission behavior of a propagation medium.

The method comprises a first and a second mode, wherein each mode is closed for itself. What is exemplary for mode 1 is that within the signal exchange, additional information is transmitted within the measurement signal, whereas mode 2 may only use the data interface for the transmission of this information. One system operates in each case in one of the modes within a period of time. Switching between the modes is possible.

By means of the method, it is possible to specify a transfer function for the propagation behavior of a propagation medium from the initiator to the transponder or from the transponder and to the initiator (also referred to as 1WR one-way transfer function), or for one cycle, that is, one transfer from the initiator to the transponder and from the transponder back to the initiator (also known as a 2WR two-way transfer function).

From the determined transfer function in the frequency domain, in turn, the distance between the involved radio nodes can be ascertained.

The phase response between the signals is particularly important. If the propagation behavior within a medium is dominated by the direct path, then the group delay $t_g$ of the electromagnetic wave can be calculated from the phase response from a derivation.

$$t_g = \frac{d\varphi}{d\omega}$$

The speed of propagation c of the electromagnetic wave creates a direct relationship to the distance d between the radio nodes corresponding to $d=c*t_g$.

A characteristic of all measurement methods is the mutual transmission of a reference signal, i.e., of the initial signal or the response signal, which is received by the other node, wherein the position of the received signal in the complex plane is evaluated with regard to its internal time reference.

A sequence of steps of the first step and the second step represents a core operation, which is also referred to as an atomic operation or ping-pong.

The phase coherence must be preserved at a minimum for one step sequence.

The transmission channel in many cases is characterized in several ways, wherein in addition to the direct connection between two radio nodes, other paths can also be created by reflection on objects and/or by refraction and/or by diffraction.

In order to resolve multiple paths in the received signals, the sequence of steps, i.e., the mutual transmission and reception of reference signals, is repeated several times in frequency steps over a bandwidth (predetermined frequency domain). In this way, the transfer function can be determined on the basis of a set of interpolation points in the frequency domain.

The bandwidth of the predetermined frequency domain is decisive for the ability of the method to resolve signal paths having different lengths. Since it is a frequency-discrete representation, the frequency interval determines the range over which a distance can be unambiguously determined, while at the same time limiting the size of the unambiguously determinable time offsets.

A plurality of step sequences is referred to as a measurement cycle. The duration of the measurement cycle is dependent on the number, type and duration of the individual step sequences and the frequencies used.

Maintenance of the phase coherence of the signals over a limited period of time and between radio nodes is an important property of the method and a prerequisite for the reconstruction of the signal profile.

Depending on the embodiment, the coherence requirement can be extended to a plurality of step sequences, i.e., a measurement cycle or also a plurality of measurement cycles.

In addition to the distance, an extraction of further parameters, for example, an angle of incidence between radio nodes (two or more) for relative position determination is also possible. For this purpose, the received signals of several antennas must be evaluated, or the transmitted signals must be definedly distributed to several antennas. This can be done in parallel/simultaneously by using several transmitting and receiving units. Alternatively, the antennas can also be assigned chronologically successively in different time windows within the sequence of steps and by switching the antennas between the time windows. During switching, corresponding settling times must be taken into account.

The predetermined frequency domain preferably corresponds, for example, to the available frequency domain, i.e., it depends on the bandwidths provided by the radio nodes used. Alternatively, the technically possible frequency domain is restricted on the basis of legal requirements and/or due to a specific application, so that the predetermined frequency domain may comprise only a partial range of the available frequency domain.

Each radio node follows a fixed temporal sequence which is permanently bound to the timer and the corresponding cycle controller and is therefore deterministic. This means that all function blocks have a fixed time and phase reference over the required periods and fulfill the respective requirements for phase coherence. Because the time response of the radio nodes among the nodes a priori is known (with the exception of initial phase position, time offset and frequency offset), a coherence relationship is produced between the radio nodes.

However, for the execution of the method it is important that the corresponding transmission and reception periods (possibly also transmission and reception time windows) are also opposite, and that corresponding settling times are completed, i.e., a stationary state has been established.

The tolerable fluctuation of the time offset, which is protected by rough synchronization, is based on the size of the measurement range and should be less than 1 μs for a measurement range of 300 m, for example, in order to avoid increased amounts of time and frequency offset correction. The achievable measurement accuracy in the 2.4 GHz range is below 1 m.

With respect to this characteristic, this method differs significantly from established UWB TDOA (time difference of arrival) techniques. Since here the measurement accuracy is determined by the synchronization, the synchronization quality needs to be better than 3 ns with a comparable accuracy.

As noted, each radio node has its own time reference. The time reference is preferably designed as a crystal oscillator (XTAL/XOSC). It is understood that the rough time alignment does not replace the determination of the actual time offset in a core operation, but rather is a prerequisite.

An advantage is that the flexibility of the process and reliability are increased. Another advantage is that the method can be carried out more quickly and cost-effectively. In particular, the method can be used advantageously when determining the position of radio nodes in the region of the sensor networks. Furthermore, the method allows for high-resolution distance measurements to be carried out in large coverage areas, that is, in a range of 0.5 m to 10 km. In particular by means of using narrow-band architectures, i.e., channel filter bandwidth of less than 1 MHz, a high dynamic range and high interference immunity are achieved.

The determination of the time offset, or the time offset of two radio nodes involved in the communication is important for further processing of the measurement results.

In a further development, the time offset can also be used to synchronize units of a system and therefore is of great importance.

Any other type of data exchange is referred to as a data interface, for example, a communication protocol for a wireless exchange, for example Bluetooth, Zigbee or IEEE 802.11, which allows for an exchange of data frames for rough synchronization. Alternatively, the data interface can be designed as a data line or connection for a data line.

If, according to the first mode, the response signal is formed at least from a portion of the received initial signal, information about the received initial signal is accordingly transmitted directly back to the initiator. The received response signal thus contains information about the outward and return path between the radio nodes. This makes it possible for the 2WR transfer function to be determined solely on the basis of the response signals received.

If, according to the second mode, the response signal is formed independently of the initial signal, then according to a first alternative embodiment, at least one received signal vector determined by the transponder is transmitted to the initiator via the data interface. In this way, further evaluation can be carried out by the initiator or by a computing unit communicating with the initiator.

The 2WR transfer function can be determined on the basis of the received response signals and the received and transmitted initial signals.

The time offset can be determined on the basis of at least two received initial signals and at least two received response signals. Determining the time offset is a necessary prerequisite for determining the 1WR transfer function.

The time offset can be determined both in the first mode as well in the second mode.

An advantage of the method according to the invention is therefore that no further data transmission of all, or at least many, of the measurement results of the transponder is necessary. As a result, both the technical outlay and the amount of time can be reduced.

According to a first embodiment, the second carrier frequency corresponds to the first carrier frequency. Alternatively, the second carrier frequency differs from the first carrier frequency.

The temporal course of the carrier frequencies or the frequency changes may be known in advance to the radio nodes involved. For example, the second carrier frequency is always changed in accordance with the first carrier frequency. Alternatively, the change of the second carrier frequency is made independently of the change in the first carrier frequency or not at all.

The change, i.e., the frequency step carried out during a repetition, is the same for each repetition or changes with each repetition, for example according to a predetermined list or mathematical function known to all radio nodes that also includes the temporal behavior and so that the required phase coherence can be obtained.

A measurement cycle can be formed from a number of repetitions of the step sequence and the initial signal and the response signal are coherent at least during one measurement cycle or at least during several measurement cycles. The mutually coherent measurement cycles are particularly advantageous when using several antennas within a radio node and/or further radio nodes.

A first complex signal vector (receive signal vector) can be determined from the received initial signal, wherein the response signal is formed from the first complex signal vector or alternatively from the reciprocal first complex signal vector.

In a first alternative, the response signal received by the initiator can correspond to a frequency-by-frequency multiplication of the complex signal vector with the channel transfer function of the propagation medium. As a result, the square of the channel transfer function sampled discretely in the frequency domain is produced. The discrete-time sampled convolution of the channel impulse response with itself is obtained in the time domain.

The response signal received by the initiator can provides a delay operator $e^{j\omega*2*T_{off}}$, which allows for the determination of the time offset between the two radio nodes. The 1WR channel transfer function can be determined using the time offset.

Furthermore, the determined time offset can also be used as a manipulated variable within precision synchronizations and also for testing a temporal synchronization of function blocks.

A first complex signal vector can be determined, and the response signal can be formed from the conjugate complex first complex signal vector.

The received response signal is formed of the square of the first complex signal vector and a delay operator $e^{j\omega*2*T_{off}}$, which indicates the time offset between the nodes.

A first phase can be determined from the received initial signal, wherein the response signal can be formed either from the first phase or from the inverted first phase. These alternatives are particularly quick and easy.

At least one radio node can always operate as an initiator and always at least one radio node as a transponder, wherein each radio node operates at least once as the initiator and at least once as the transponder over a plurality of step sequences, or each radio node operates only as the initiator or only as the transponder over a plurality of step sequences.

A measurement cycle of a plurality of repetitions of the step sequence can be formed and the first carrier frequency assumes a predetermined value within the frequency domain for each repetition during the measurement cycle.

For example, a frequency sweep is carried out, wherein the first carrier frequency is increased or reduced by a constant value within the predetermined frequency domain with each repetition during the measurement cycle. A sweep can be implemented with little implementation effort. As a rule, it is easier to maintain phase relationships over a number of smaller frequency steps. However, due to legal provisions, this embodiment is limited for many applications in respect of the permitted transmission power.

A more irregular change in the frequency is also known as frequency hopping. The different frequencies or values for the carrier frequency for each individual repetition are stored, for example, in a lookup table or are based on a predetermined mathematical function. For example, the frequency hopping can be carried out based on pseudo noise sequences, as a result of which a high robustness against interference sources is achieved. At the same time, this allows for using higher transmission powers in compliance with a wide variety of legal provisions and regulatory requirements. It is thus possible to expand the use of the method to a greater reach.

A distance between the at least one initiator and the at least one transponder can be determined based on the determined transfer function and/or the time offset.

A multipath analysis can be carried out for at least one determined channel transfer function. The multipath analysis focuses on determining the direct propagation path.

A filter can be applied to the received response signals and/or the received initial signals, prior to the determination of the transfer function and/or the time offset. As a filter, for example, a $\cos^2$ window can be used to suppress secondary maxima. Higher measurement dynamics or noise reduction can, for example, take place by averaging the measured values within a sequence of steps.

In addition to the carrier frequency of the initial signal, an amplitude and/or a phase of the initial signal can be changed with each repetition.

At least three radio nodes can be provided and in each step sequence, the second step is repeated at least once, wherein the initial signal is received in the first step by at least two radio nodes functioning as transponders, the response signal is sent by exactly one of the transponders in every second step and is received by the initiator and at least one further transponder, a different transponder transmits the response signal each time the second step is repeated, and in the first mode with every repetition of the second step, the response signal is formed in each case each time from at least from a portion of the received initial signal or from a portion of the received response signal.

The initiator transmits the initial signal during a first transmission period and the transponder transmits the response signal during a second transmission period, wherein the first transmission period and the second transmission period each comprise a plurality of successive time windows, each are sent only during the time window and each have two successive time windows following one another immediately in time or are offset from one another in time.

The reception periods can also comprise a plurality of time windows, wherein the time windows of the transmission periods, and the time windows of the reception periods can, but do not have to, correlate with one another (apart from the time offset).

This approach allows in particular for adapting to different application adaptations, such as separate transmission of the reference phase, signaling between initiator and transponder (amplification and transmission power adjustments, encryption), noise reduction by averaging, assignment to different antennas to produce space diversity for determining angles of incidence in particular and for improving measurement accuracy in general (beam steering, MIMO, Smart Antennas), or for the detection of channel assignments in the sense of LBT (Listen-before-Talk), CS (Carrier Sense) and DAA (Detect and Avoid) requirements for the approval of radio systems.

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein:

FIG. 3 shows a table with an overview of various transmit vectors, receive vectors, baseband vectors and the corresponding dependencies.

DETAILED DESCRIPTION

Figure 1:
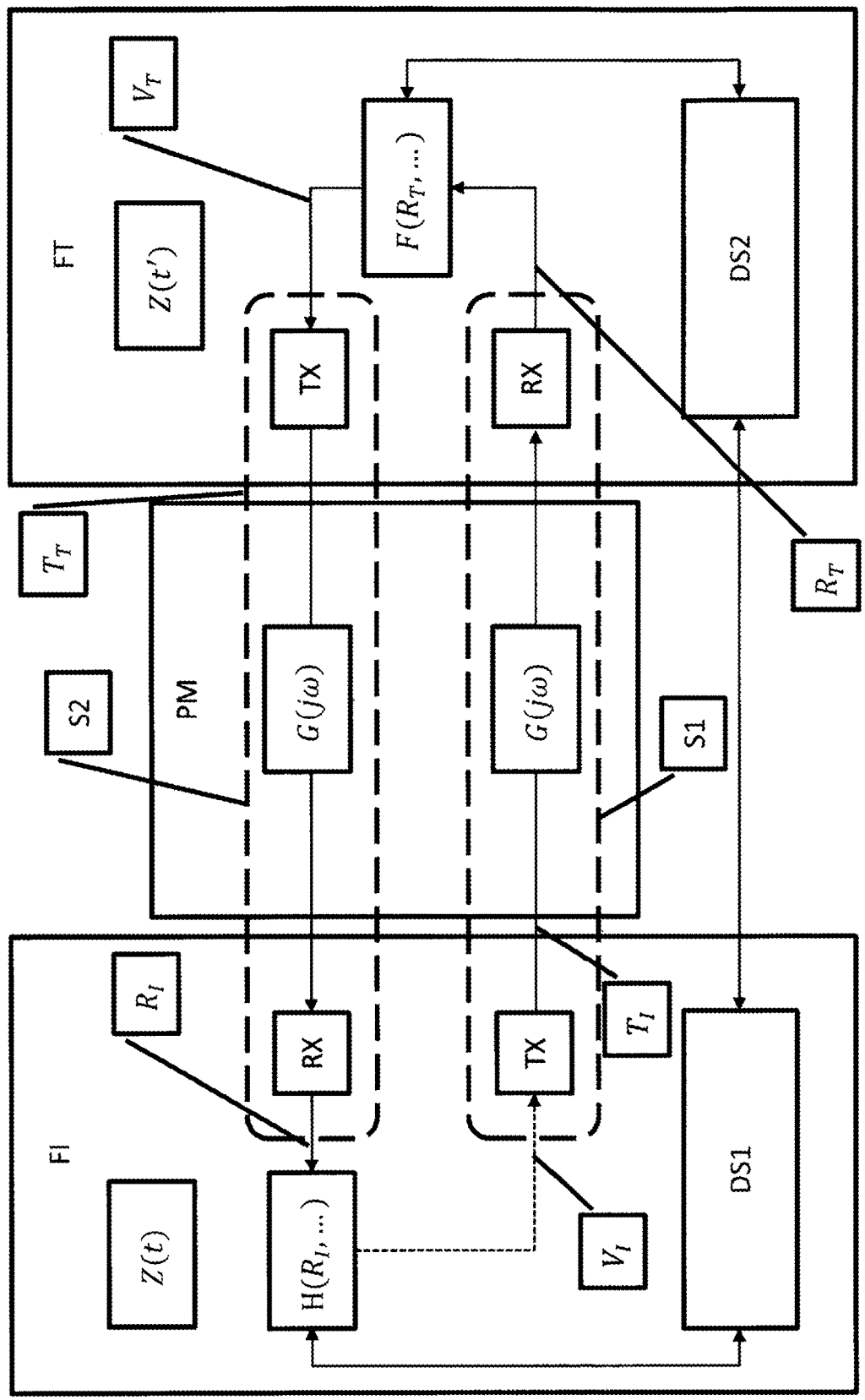
FIG. 1 shows a measurement arrangement for radio measuring applications in accordance with an exemplary embodiment.

A first radio node FI, called the initiator, and a second radio node FT, called the transponder, are provided. The initiator FI and the transponder FT each have a receiving unit RX, a transmitting unit TX, a data interface DS1 or DS2 and their own timer Z(t) or Z(t'). It is understood that each radio node contains a signal processor.

The data interfaces DS1 and DS2 are designed as a communication protocol for wireless data exchange.

The initiator radio node FI has a time base t and the transponder radio node FT has a time base t', wherein the two time bases t and t' are independent of each other.

It should be noted that the term time base and the term time domain are used interchangeably.

The corresponding timers Z(t) and Z(t') each comprise a crystal oscillator and specify a measure of time for the respective time base t, t' of the respective radio node.

The timers Z(t) and Z(t') are mutually offset by a time offset $T_{offs}$. It is assumed that the timers Z(t) and Z(t') progress in the same units, i.e., there is no frequency offset between the crystal oscillators.

If there is a frequency offset between the two timers Z(t) and Z(t'), the frequency offset must be corrected so that the method can be performed. A correction of the frequency offset is not the object of this application.

The timers Z(t) and Z(t') each generate a time reference for a sequence control in the initiator radio node FI and the transponder radio node FT. The sequence control controls the time behavior of all relevant function blocks in the respective radio nodes FI and FT. In particular, the sequence control specifies the times for a frequency change. It should be noted that the sequence control is also referred to as time-frequency control ZFS1 and ZFS2.

It should be noted that the temporal lengths $T_{MU}$ or $T'_{MU}$ each designate a predefined smallest time interval, wherein the smallest time interval is also referred to as time measurement unit $T_{MU}$.

It should be noted that the method includes: steps comprising one or more transmission windows or reception windows, step sequences comprising at least two steps with a time length $T_{SF}$ for the initiator FI or a temporal length $T'_{SF}$ for the transponder FT, measurement cycles as a series of step sequences with a temporal length $T_Z$ for the initiator FI or a temporal length $T'_Z$ for the transponder FT, and series of measurement cycles.

Each sequence of steps has transmission and reception ranges, which are each divided into transmission windows and reception windows. The temporal length of a respective transmission or reception window of the radio node FI is $T_{MU}$. The temporal length of a transmission or reception window of the radio node FT is $T'_{MU}$.

Each radio node FI has a transmission window with a temporal length $T_{MU}$ and a reception window with a temporal length $T_{MU}$. Each radio node FT has a transmission window with a temporal length $T'_{MU}$ and a reception window with a temporal length $T_{MU}$.

The index n can indicate the position of the time windows within one of the sequences of steps and has a time length of $T_{SF}=n_{max}*T_{MU}$. The index has a range of values $n=0.1, \ldots (n_{max}-1)$, wherein $n_{max}$ is determined by the specific design of the measurement cycle.

The index m can indicate the position of the sequence of steps within the measurement cycle, wherein $m=0.1, \ldots (m_{max}-1)*m_{max}$ is determined by the specific embodiment and is, inter alia, dependent on the number of frequencies for which the transfer function is to be determined. A series of step sequences is referred to as the measurement cycle. A measurement cycle of the radio node FI has a length of $T_Z=m_{max}*T_{SF}$. A measurement cycle of the radio node FT has a length of $T'_Z=m_{max}*T'_{SF}$.

To differentiate between initiator radio node FI and transponder radio node FT, the corresponding dimensions of the transponder are indicated by markings (for example, frequencies and times of the $f'_p$, $\omega'_p$, t', ...).

In the following example, a distinction is made between continuous-time variables and discrete-time variables. In particular, the transmitting units TX of the initiator radio node FI or the transmitting units TX of the transponder radio node FT generate continuous-time transmission signals $T_I(t)$ or $T_T(t')$, wherein the representation $T_I(m, n)$ denotes the value of a transmission signal $T_I$ with respect to the time base t at a time $t=n*T_{MU}+m*T_{SF}$. Correspondingly, the representation $T_T(m,n)$ denotes the value of a transmission signal $T_T$ with respect to the time base t' at a time $t'=n*T'_{MU}+m*T'_{SF}$.

With regard to the phase coherence, it is noted that the transmitting and receiving unit of the transponder form a phase-coherent domain together with the timer Z(t) and the time-frequency sequence control.

For a required length of time, i.e., for any number of steps, the phase-coherent domain of the radio node FI is characterized by a fixed relationship between the phase position of the transmission signals $T_I(m, n)$ for all indices n within a sequence of steps in which the transmitting unit transmits and the reference phase for determining the receive vectors $R_I(m, n)$ for all indices within a sequence of steps in which the receiving unit receives.

The same applies to the transponder, namely that the phase-coherent domain of the radio node FT is characterized by a required temporal length, i.e., for any number of steps, by means of a fixed relationship between the phase position of the transmission signals $T_I(m, n)$ for all indices n within one sequence of steps in which the transmitting unit transmits and the reference phase for determining the receive vectors $R_I(m, n)$ for all indices n within a sequence of steps in which the receiving unit receives.

If the phase coherence is limited to a sequence of steps, the coherence length is $T_{SF}$ for the radio node FI, or $T'_{SF}$ for the radio node FT. If the phase coherence is expanded to a measurement cycle, then the coherence length is $T_Z$ for the radio node FI and $T_Z$ for the radio node FT.

In a series of measurement cycles, the coherence is extended accordingly to the temporal length of the series of measurement cycles.

The transition regions, which are characterized by settling times, can be excluded from the requirement for coherence.

The requirements regarding phase coherence of the respective radio nodes result in a phase coherence of the radio nodes with respect to one another if the timers differ only by one time offset, otherwise both nodes follow the same time sequence based on $T_{MU}$ or $T'_{MU}$, the reception and transmission behavior being complementary to one another.

The illustration in FIG. 1 shows an arrangement of two radio nodes, the initiator FI and the transponder FT, for carrying out a first embodiment of an inventive method for radio measuring applications, wherein the arrangement is adapted to perform a first mode of the inventive method.

The initiator FI is designed to transmit an initial signal $T_I$ during a first step S1 by means of the transmitting unit TX over a propagation medium PM, for example air. The transponder FT is designed to receive the initial signal $T_I$ transmitted by the initiator FI during the first step S1 as a receive signal $R_T$ after transmission over the propagation medium PM.

The receiving units RX of the initiator radio node FI and RX of the transponder radio node FT transform the received signals into a discrete-time representation. The reception results $R_I$ and $R_T$ will still be referred to as receive vectors.

The receive vectors $R_T(m, n)$ take the form of a complex number, the amount being proportional to the magnitude of the received signal.

The phase of the complex vectors $R_T(m, n)$ is determined relative to the time base t' at the times $t'=n**T'_{MU}+m*T'_{SF}$.

In addition, the transponder FT can be designed to determine a signal vector $V_T$ from the received signal $R_T$ using a function F $(R_T, \ldots)$ and to exchange it by means of the data interface DS2.

In order to be able to execute the first mode of the method according to the invention, the transponder FT is additionally designed for transmitting the signal vector $V_T$ to the transmitting unit TX and to process it further by means of the transmitting unit TX.

During a second step S2, the transponder FT transmits a response signal $T_T$ by means of the transmitting unit TX.

During the second step S2, by means of the receiving unit RX, the initiator FI receives the response signal $T_T$ emitted by the transponder after transmission over the propagation medium PM as the receiving signal $R_I$.

The receive vectors $R_I(n, m)$ of the initiator take on the form of a complex number, the amount being proportional to the magnitude of the received signal. The phase of the complex vectors $R_I(m, n)$ is determined relative to the time base t at the times $t=n*T_{MU}+m*T_{SF}$.

Moreover, the initiator FI is designed to determine the signal vector $V_I$ from the received signal $R_I$ using the function $H(R_I, \ldots)$ and to exchange it with the data interface DS1.

The influence of the transmission over the propagation medium PM on the transmitted signals is referred to as the transfer function G.

A method sequence according to the first alternative embodiment of the method for radio measuring applications is explained in more detail below with reference to FIGS. 2, 3 and 4.

Figure 2:
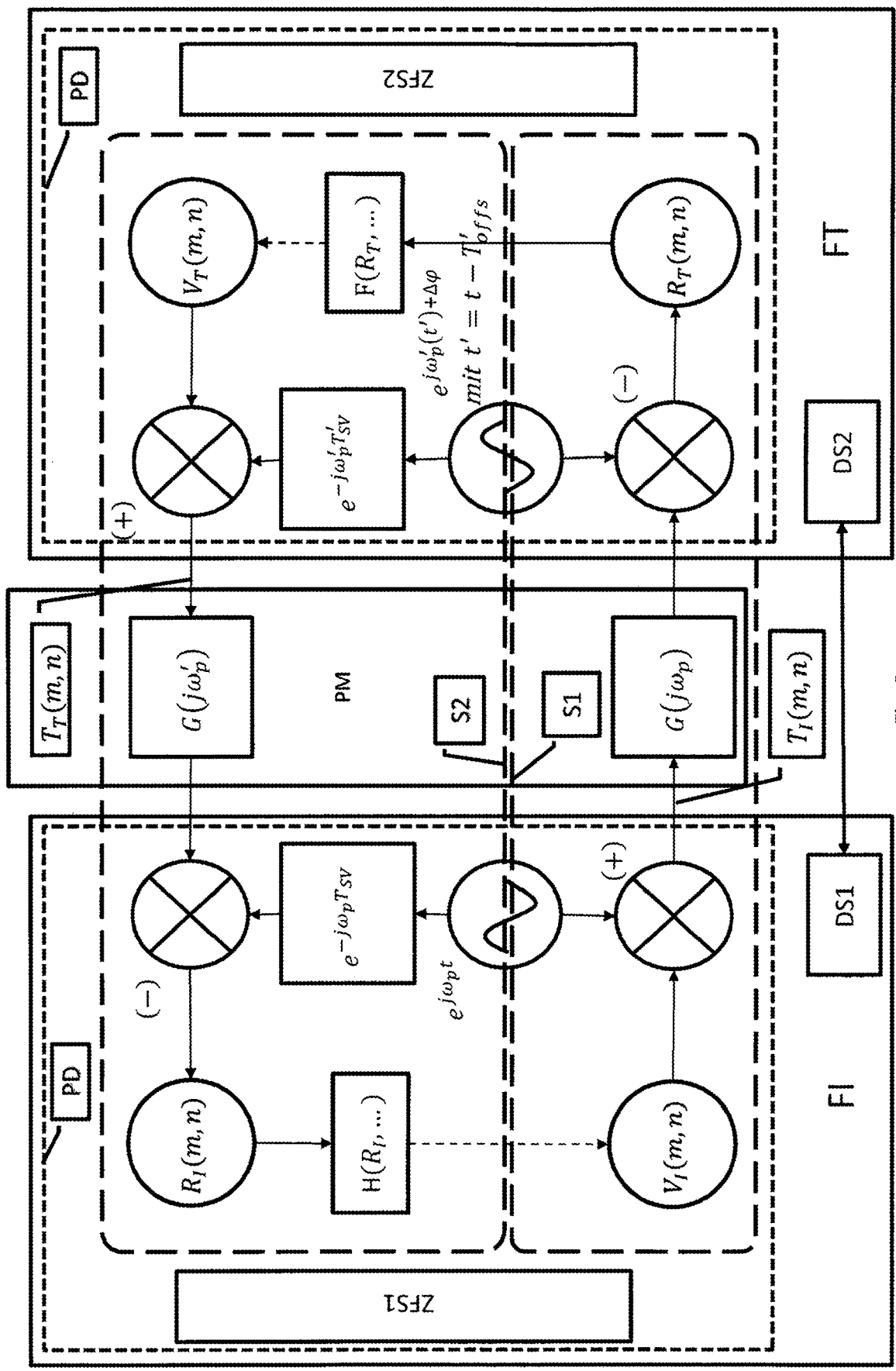
FIG. 2 is a flow chart of an exemplary embodiment.

As shown in FIG. 2, both radio nodes FI and FT each have a generator, an upward mixer which converts a complex signal vector VT or VI from the baseband to the HF position, a downward mixer which converts a high-frequency signal to a signal vector RI or RT in the baseband, and a time and frequency control ZFS1 or ZFS2 containing the timer Z (t) or Z (t'), which controls all system changes of state in a fixed time regime.

The time and frequency control ZFS1 or ZFS2 works on the basis of a time unit $T_{MU}$ and ensures that all relevant changes of state (sampling of the signal vectors, RX/TX-TX/RX transitions, frequency changes) are connected with the time base specified by the respective timer and can be related to this.

The time and frequency control ZFS1 or ZFS2 is also responsible for ensuring that the coherence between the signals and vectors is maintained over the required length, i.e., that settling times are taken into account and all the functional units, even in the transition regions, are located in the linear control ranges (such as a frequency synthesizer, PLL). The radio nodes FI and FT are controlled by the time and frequency control ZFS1 and ZFS2 during the step sequence of steps S1 and S2.

The step sequence also includes the transition regions (step delay), which are shown as delay elements of the size $T_{SVS}$. The time and frequency control ZFS1 or ZFS2 also controls the frequency $\omega_p$ over an available frequency domain.

As a result, the time and frequency control ZFS1 and ZFS2 each generate a phase-coherent domain PD, in which the high-frequency synthesis, the generation of the corresponding transmit vectors and the extraction of the receive vectors are in a fixed relationship to one another on the phase side.

Furthermore, each radio node has a logic unit which supplies the signal vectors $V_T$ or $V_I$ for generating the corresponding transmission signal $T_I$ (m, n) or $T_T$ (m, n) by using a function F or H based on input parameters (such as the received signal vectors $R_I$(m, n) and $R_T$(m, n) and/or the parameters provided via the data interface DS1 or DS2).

The maximum index of the step sequence $n_{max}$ is determined from the concrete interpretation of the measurement cycle and is selected to be $n_{max}$=6 in the example shown.

Figure 4:
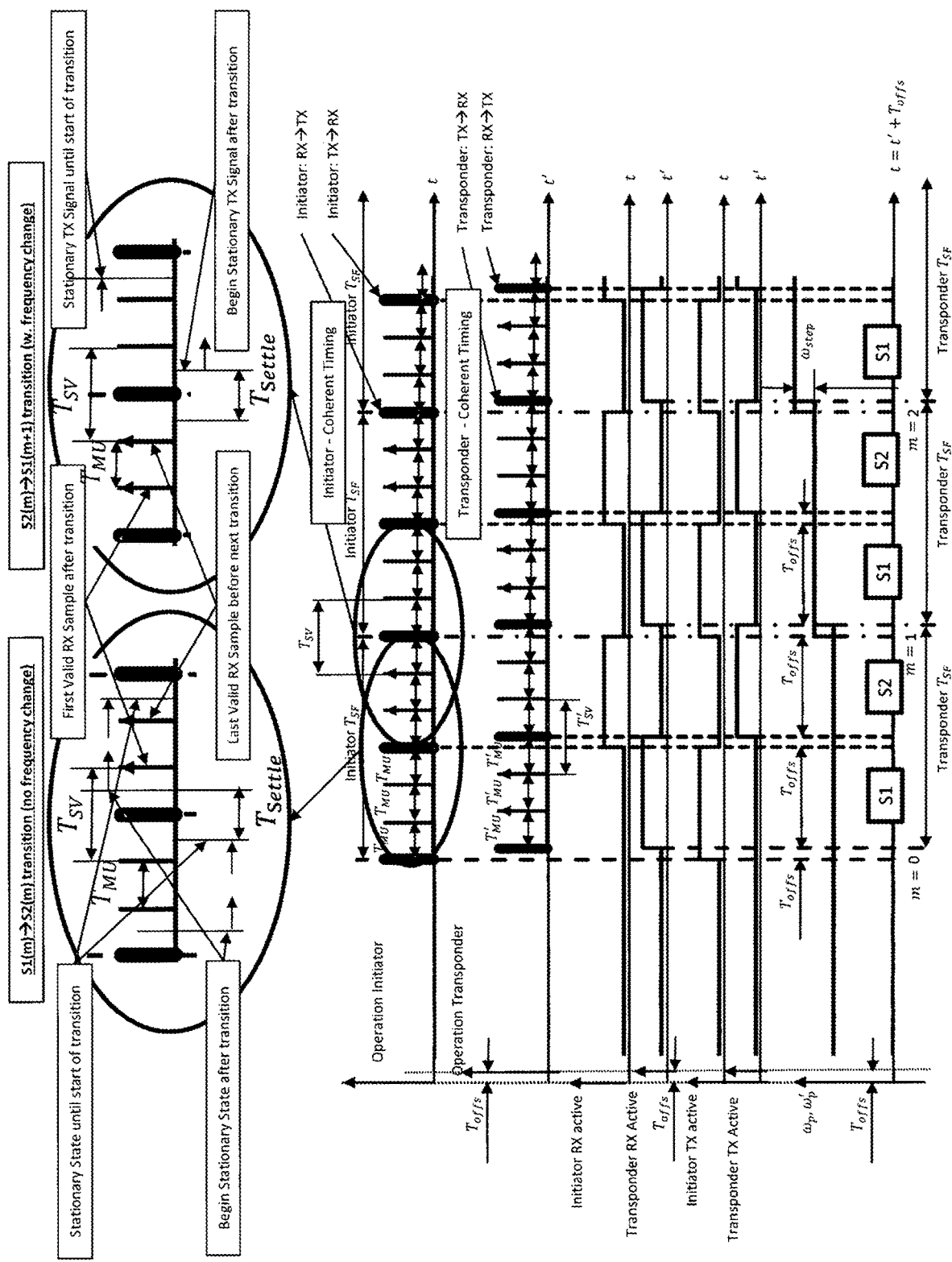
FIG. 4 is a diagram of a first temporal course of the method for radio measuring applications according to an exemplary embodiment.

As illustrated in FIGS. 2 and 4, in the initiator FI and in the transponder FT, the frequency generator first generates a signal of the frequency $f_p$, $f_p'$ or $\omega_p = 2\pi*f_p$, $\omega'_p = 2\pi*f_p$, wherein the signal of the frequency generator of the transponder is delayed by the time offset $T_{offs}$ and has a static phase offset $\Delta\varphi$.

For the purposes of the further explanation, the frequencies are considered to be equal in size. It is assumed that corresponding frequency offset corrections (if necessary) have already been carried out or that the necessary parameters have already been extracted to correct the receive vectors accordingly. Thus, for the other statements, $f_p = f_p'$ is assumed, wherein the method also includes frequency differences $f_p = f_p' + \Delta f$, if $\Delta f$ is known, for example, has been provided by the receiving architecture.

In a first step S1 m=0, n=0,1,2, the initiator FI uses a mixer and the frequency generator to generate an initial signal $T_I$ (m, n) with a first carrier frequency $\omega_p$ with the signal vector $V_I$(m, n) and couples said initial signal out into the propagation medium PM as initial signal $T_I$ (m, n). To illustrate, and as can be seen in the table shown in FIG. 3, the signal vector is $V_I$ (m, n)=1, i.e., the initiator radio node transmits a reference signal with a carrier frequency ωp as the initial signal $T_I$.

The above-described does not exclude the signal vectors $V_{I, T}$ from being brought to an intermediate frequency IF before coupling out, in a further mixer by multiplication with a subcarrier often referred to as a local oscillator, before the signal is finally converted to the actual target frequency ωp.

During a first reception period S1 with m=0, n=0,1,2, the transponder FT determines a receive vector $R_T$ (m, n) by mixing the received HF signal with the signal of the frequency generator of the frequency $f_p$, which is shifted in time by Toffs with respect to the generator signal of the initiator.

The receive vectors $R_T$ (n, m) take the form of a complex number, the amount being proportional to the magnitude of the received signal.

In FIG. 2, the phase of the signal vector $R_T$ (m, n) determined by the receiving unit of the transponder is generated by sampling the transmission signal $T_I$ transmitted over the propagation medium with respect to the continuous-time signal $\exp(j\omega'_p*t')$ at the times $t'=t'=n*T'MU+m*T'_{SF}$.

The received signal $R_T$ (m, n) is largely determined by the transfer function of the radio channel on the frequency $f_p$ and the time offset and phase offset $T_{offs}$ or $\Delta\varphi$ between the timers.

In the context of the method, $T_{MU}=T'_{MU}$, $T_{SF}=T'_{SF}$, $T_Z=T'_Z$, and so on. Based on the receive signal $R_T$ (m, n), a signal vector $V_T$ (m, n+3)=F ($R_T$ (m, n), ...) is formed and transmitted as a signal vector $V_T$ to the transmitting unit TX of the transponder FT.

The transponder also forms a discrete-time system with $t'=n*T'_{MU}+m*T'_{ASF}$.

In the second step S2 m=0, n=3, 4, 5, a transmit signal $T_T$ (m, n) with the frequency $f'_p$ is generated by the transponder FT from the determined baseband vector $V_T$ (m, n) using a mixer and the frequency generator and is coupled out as a response signal $T_T$ into the propagation medium PM.

The response signal $T_T$ m=0, n=3,4,5 is obtained from the receive vector $R_T$ (m, n) m=0, n=0,1,2 using the function $F(R_T$ (m, n), ...) and thus formed at least from a portion of the receive vector $R_T$. Some options for the formation of the response signal $T_T$ can be found in lines 2 to 6 of the table in FIG. 3.

During a second reception period m=0, n=3,4,5, the initiator FI determines the receive vector $R_I$(m, n), ...) with m=0, n=3,4,5.

The receive vectors $R_I$ (n, m) take the form of a complex number, the amount being proportional to the magnitude of the received signal.

Analogously, the phase of the signal vector RT (m, n) determined by the receiving unit of the initiator is obtained by sampling the transmitted transmission signal TT sent over the propagation medium with respect to the continuous-time signal $\exp(j\omega_p*t)$ at the time $t=t=n*T_{MU}+m*T_{SF}$.

The received HF signal of the frequency $f_p$ is converted to the baseband using a mixer and the signal of the frequency generator of the frequency $f_p$. The corresponding receive vectors $R_I$ are also provided in the table in FIG. 3.

The corresponding discrete-time values for the initiator result from $t = n*T_{MU} + m*T_{SF}$ and for the transponder from $t' = n*T'_{MU} + m*T'_{SF}$.

With reference to FIG. 2, the transmitting and receiving unit of the transponder, together with the timer and the sequence control, form a phase coherent domain PD, which is characterized in that the phase of the transmit signal $T_T = V_T(m, n)*\exp(j\omega'p*t')$ as $T_T$ (S2, m, n) at the time points $t' = n*T'_{MU} + m*T'_{SF}$ (S2: $n = \{4, 5\}$) is phase coherent to the reference phase of the continuous-time signal $\exp(j\omega'p*t')$ for the determination of the phase of the receive vector $R_T$ at the times $t' = n*T'_{MU} + m*T'_{SF}$ (S1: $n = \{1, 2\}$).

With reference to FIG. 2, the transmitting unit and the receiving unit of the initiator, together with the timer and the sequence control, form a phase coherent domain PD, which is characterized in that the phase of the transmission signal $T_I = V_I (m, n)*\exp(j\omega_p*t)$ as $T_I$ (S1, m, n) at the times $t = n*T_{MU} + m*T_{SF}$ (S1: $n = \{1, 2\}$) is phase coherent to the reference phase of the continuous-time signal $\exp(j\omega_p*t)$ for determining the phase of the receive vector $R_T$ at the times $t' = n*T'_{MU} + m*T'_{SF}$ (S2: $n = \{4, 5\}$).

From the requirements or phase coherence of the respective radio nodes, a phase coherence of the radio nodes to each other is obtained when the timers differ only in time offset and otherwise both nodes follow the same timing based on $T_{MU}$, or $T'_{MU}$; the reception and transmission behavior is complementary to each other.

As can be seen in the table in FIG. 3, by transmitting information about the received initial signal $T_I$ using the response signal $T_T$, it is possible to directly determine a transfer function for the circulation (step sequence from step S1 and step S2) and/or a time offset on the basis of the received response signals $T_T$. A selection of possible receive vectors and response signal vectors is listed in the table in FIG. 3.

A step sequence from the first step S1 and the second step S2 is repeated several times, wherein for each repetition, the carrier frequencies $\omega_p$ and $\omega'_p$ are selected within a predetermined frequency domain according to the corresponding requirements. In the exemplary embodiment shown, the second carrier frequency $\omega'_p$ corresponds to the first carrier frequency $\omega_p$.

The repetitions of a sequence of steps form a measurement cycle, wherein m is incremented with each completed sequence of steps and $\omega_p$ is selected in accordance with the requirements. In the case of a frequency sweep, $\omega_p$ is increased by $\omega_{step}$ with each measurement cycle.

In order to ensure a coherence of each initial signal $T_I$ and of the following response signal $T_T$ during a sequence of steps or a coherence of the initial signals $T_I$ and the response signals $T_T$ over at least one measurement cycle (in the case of more complex derivations, coherence should be extended beyond one complete measurement cycle), the initiator FI and the transponder FT each include a coherent time and frequency control, wherein a rough time synchronization, for example by exchanging data frames via the data interfaces DS1 and DS2, takes place.

The temporal course of the method is outlined in FIG. 4. Above the time axes t and $t' = t + T_{offs}$, the profile of the frequencies $\omega_p$ and $\omega'_p$, an activity of the transmitting units TX of the transponder FT and the initiator FI, an activity of the receiving units RX of the transponder FT and of the initiator FI over three sequences of steps $m = 0$ to $m = 2$ are shown, wherein a sequence of steps takes up a time length $T_{SF}$. In addition, the activities of the transponder FT and the initiator FI are shown as vertical bars, with bold bars each indicating the switching from reception to transmission or from transmission to reception, thin bars indicating the transmission of a signal, and arrows indicating the reception of a signal.

The measured time units, i.e. the time intervals between the different activities, are referred to as $T_{MU}$ or $T'_{MU}$. Between the first transmission action and the first reception action or vice versa, there is always a step delay $T_{SV}$. Thereby, influences or disruptions due to the settling process of the radio nodes are prevented. The step delay $T_{SV}$ is correspondingly greater than a settling time $T_{settle}$. At the same time, it should be noted that the presented relations assume a steady state. This condition is met only for portions of the sequence of steps, which are delimited by transition regions, in which the corresponding settling states take place. In these, the corresponding signal vectors can only be used to a limited extent in the context of the method. In the present case, this relates to the vectors $R_{I,T}$ (m, n) with $n = 0, 3$.

At least one valid receive vector per radio node per step within the step sequence is required for implementing the method in the sense described above.

Figure 5:
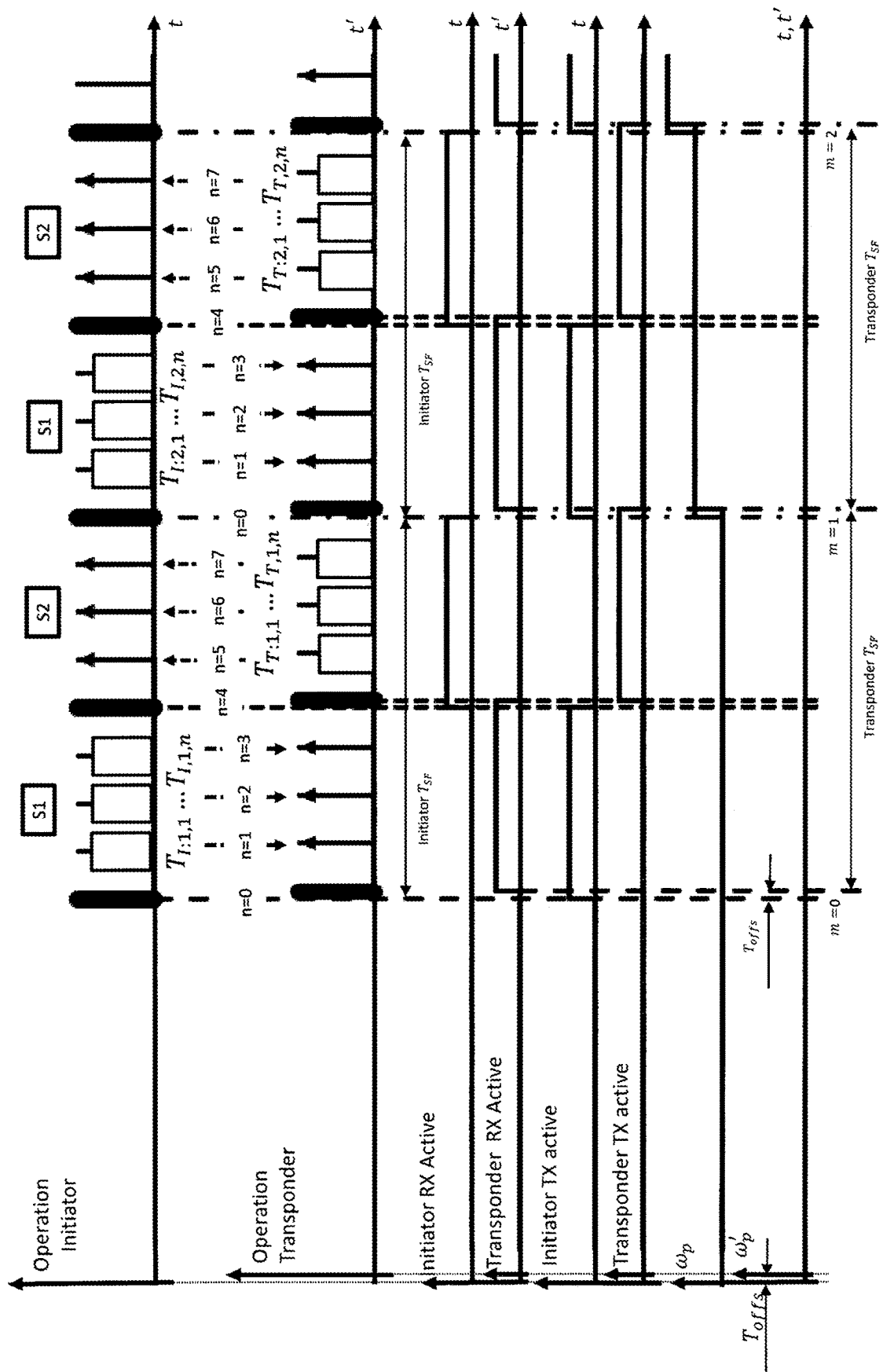
FIG. 5 is a diagram of a further temporal course of the method for radio measuring applications according to an exemplary embodiment.

The illustration of FIG. 5 illustrates a flow chart of a further alternative embodiment of the inventive method for radio measuring applications, wherein only the differences with respect to the preceding figures are described below.

The embodiment is based on an extension of the step sequence into transmission and reception periods, having a plurality of separate transmitting and receiving time windows, wherein one such configuration is illustrated with $n_{max} = 8$.

If one assumes a symmetrical distribution between the initiator FI and the transponder FT, the corresponding continuous-time transmission signals $T_{I,T}$, with their values at the times $t = n*T_{MU} + m*T_{SF}$ and $t' = n*T'_{MU} + m*T'_{SF}$ ($T_I$ (m, $n = 0: \frac{1}{2}*n_{max} - 1$) and $T_T$ (m, $n = \frac{1}{2}*n_{max} \div n_{max} - 1$)) on the other side are opposed to the corresponding number of reception time windows and thus allow for the determination of the associated receive vectors $R_T$ (m, $n = 0: \frac{1}{2}*n_{max} - 1$) and $R_I$ (m, $n = \frac{1}{2} \times n_{max} \div n_{max} - 1$).

The time windows thus available can be used for different purposes. Here is a selection: transmission of the reference phase of the transponder; signaling between initiator and transponder (amplification and transmission power adjustments, . . . , encryption); noise suppression by averaging a plurality of receive vectors, which were generated on the basis of a transmit vector of the opposite side; assignment to different antennas to produce space diversity for determining angles of incidence in particular and for improving measurement accuracy in general (beam steering, MIMO, Smart Antenna); and/or for the detection of channel assignments in terms of LBT (Listen-before-Talk), CS (Carrier Sense) and DAA (Detect and Avoid) requirements for the approval of radio systems.

When sizing, both the respective settling processes and the limits of maximum time offset fluctuations achievable by the rough synchronization should be considered, and the corresponding step delay or guard intervals $T_{SV}$ should be used.

Figure 6:
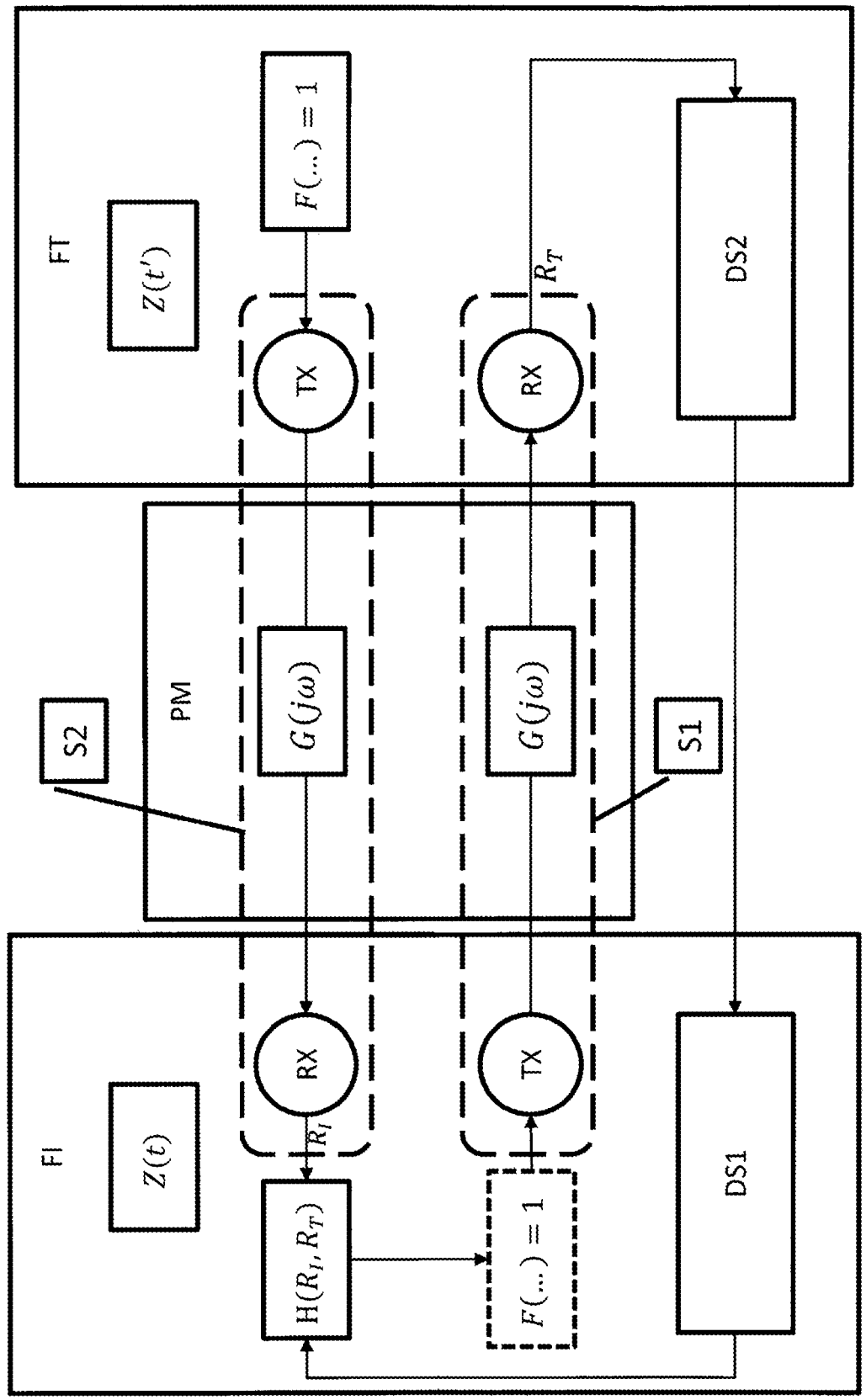
FIG. 6 shows a measurement arrangement for radio measuring applications in accordance with an exemplary embodiment.

In FIG. 6, the inventive method is shown in accordance with a first embodiment of mode 2. The differences from the previous figures are explained below.

FIG. 6 shows an arrangement of the initiator FI and the transponder FT in mode 2.

The first step S1 is initially executed in the same way as in mode 1. In the second step S2, the transponder FT is configured to generate the response signal $T_T$ by means of the transmitting unit TX, wherein the baseband vector $V_T$ to $V_T$ (m, n)=1 is selected for the generation of the response signal $T_T$.

This means that the transponder transmits a signal $T_T$ that only depends on its own time reference and is therefore independent of the received initiator transmission signal $T_I$ or the receive signal vector $R_T$ determined therefrom. This embodiment corresponds to the first line of the table in FIG. 3.

The transponder FT is additionally adapted to transmit the receive vector $R_T$ determined in the first step S1 by means of the data interface DS2 to the initiator.

The initiator FI is also adapted to receive the receive vectors $R_T$ via the data interface DS1 and to determine the time offset $T_{offs}$ based on at least a portion of the received receive vectors RT and the determined measurement vectors $R_I$.

Based on the time offset $T_{offs}$ and at least a portion of the receive vectors $R_I$ received by the initiator FI, a transfer function for the radio channel between the transponder FT and the initiator FI can be determined. It is thus possible to use the transfer function directly for a simple route between initiator and transponder and not for a two-way cycle.

As follows, the essential features of the one-way channel transfer function $G_{1WR}$ (jω)=G (jω) will be explained as compared to the widespread determination of the two-way channel transfer function $G_{2WR}$ (jω)=$G^2$ (jω).

Figure 7:
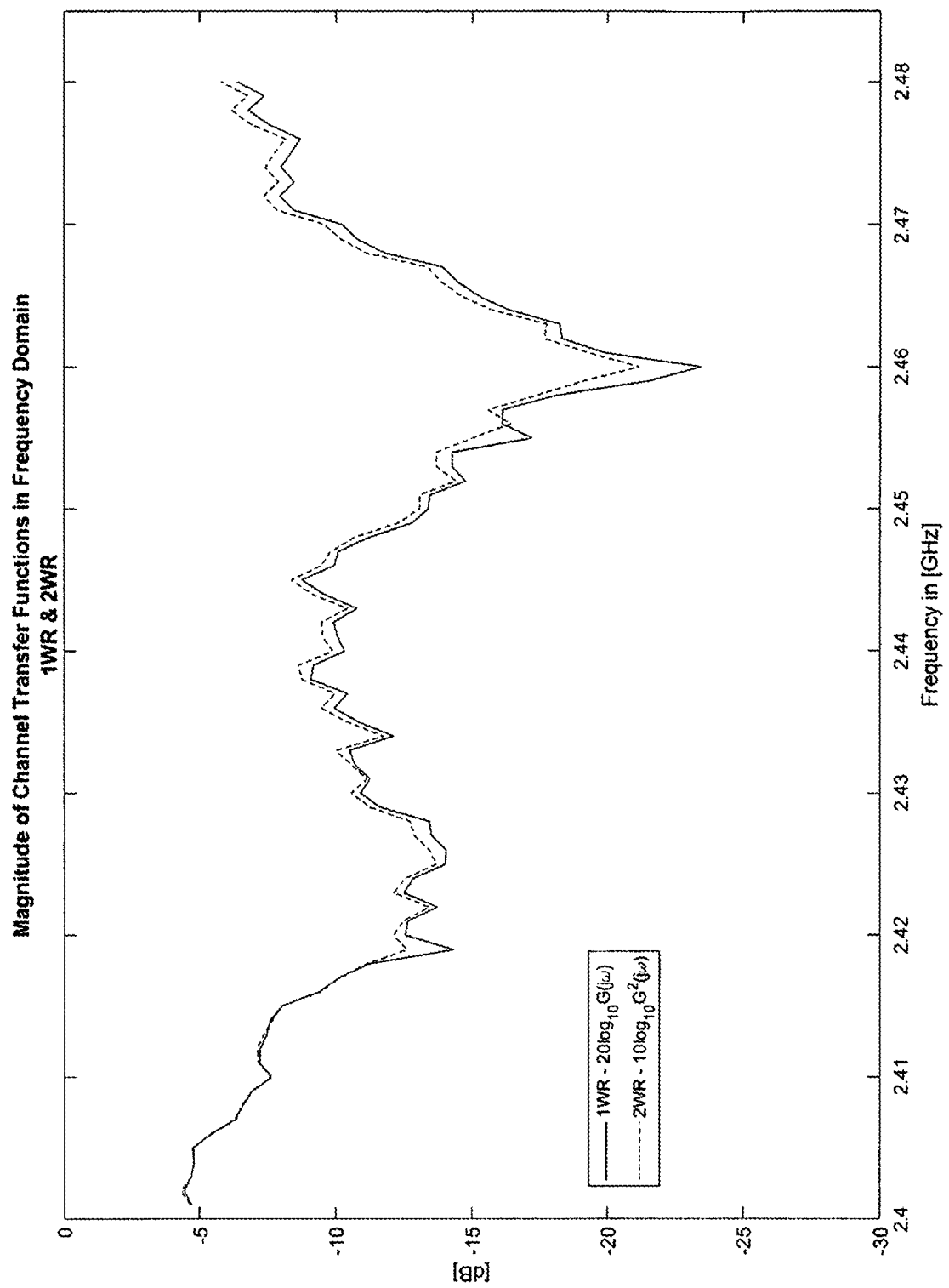
FIG. 7 shows amplitude curves of the measurement signals.

The illustration in FIG. 7 shows, by way of example, the amplitude profile in the frequency domain of both functions on the basis of measured values in a typical multipath environment. Since the two-way channel transfer function corresponds to the square of the one-way channel transfer function, the two-way channel transfer function is scaled with 10 log 10 and the one-way channel transfer function with 20 log 10. The respective profiles are approximately equal.

The meaning of the extraction of the one-way channel transfer function becomes clear with the aid of the Fourier transform in the time domain; the corresponding channel impulse responses provide information about the multipath behavior.

Figure 8:
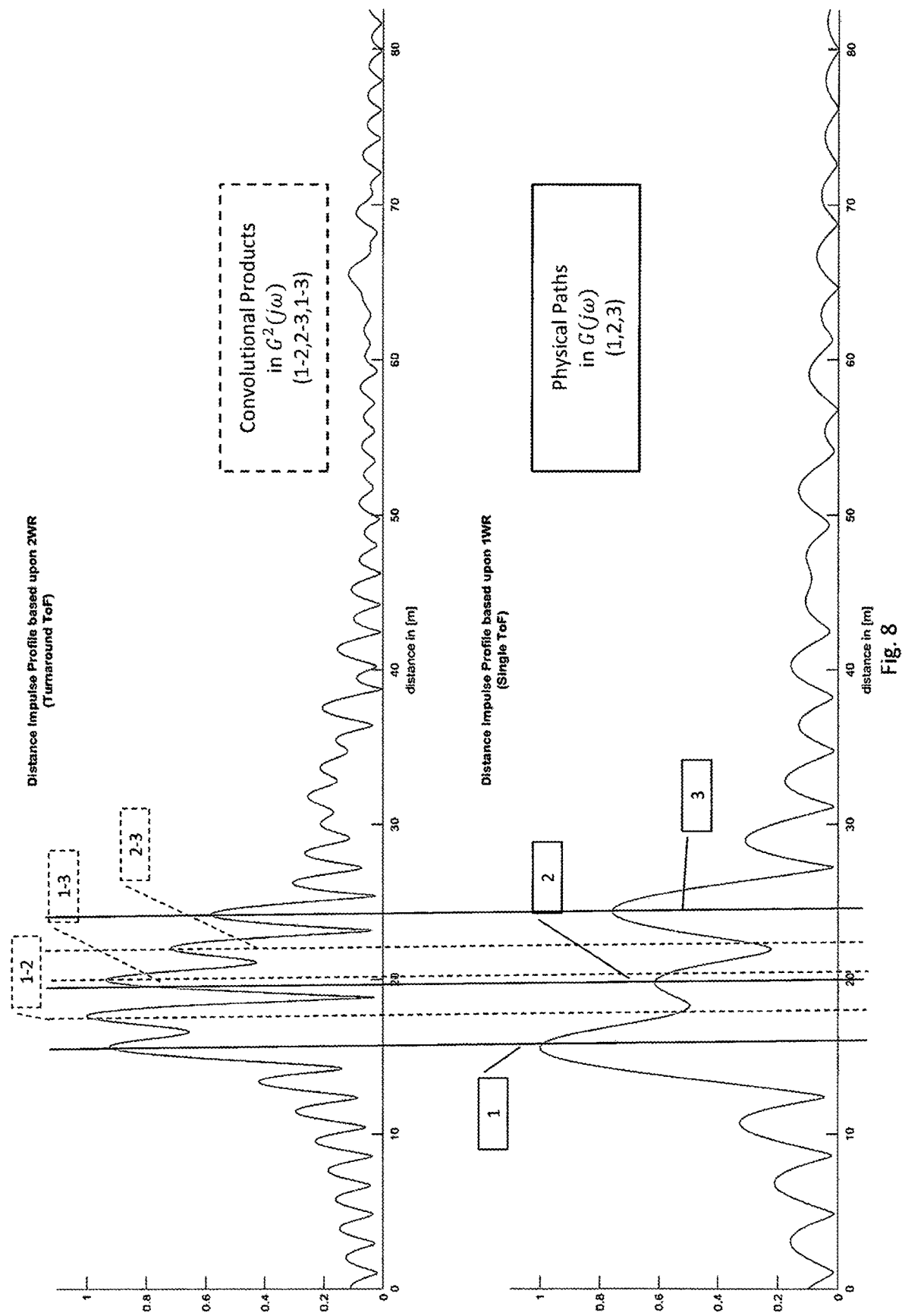
FIG. 8 shows measurement signals transformed into the time domain.

The corresponding impulse responses are shown in FIG. 8. The upper diagram shows the transfer function determined for a single path between initiator and transponder and the lower diagram shows the transfer function determined for the circulation according to the first mode. It can be clearly seen that the measurement result for one cycle is dominated more by further paths, whereas the measurement result of the one-way channel transfer function is dominated by the energy of the direct path 1 and represents further paths 2 and 3.

The cause lies in the 2-fold cycle of the electromagnetic waves through the respective propagation medium. In the time range of the convolution of the 1WR channel impulse response, the resulting transfer function corresponds to itself. In addition to the paths of the 1WR channel impulse response (1,2,3), the 2WR channel impulse response thus contains additional paths (1-2,1-3, 2-3) that arise from the convolution of the paths with each other.

As is clear from the illustration, these convolutional products can also influence the manifestation of paths 1,2,3 within the 2WR representation because they are superimposed. This becomes clear on path 2 within the 2WR representation. At the same time, it becomes clear that the convolutional products can certainly also dominate the direct paths. In the 1WR representation, path 1 is the dominant one. The 2WR result, however, is dominated by the energy of the convolution product 1-2.

Figure 9:
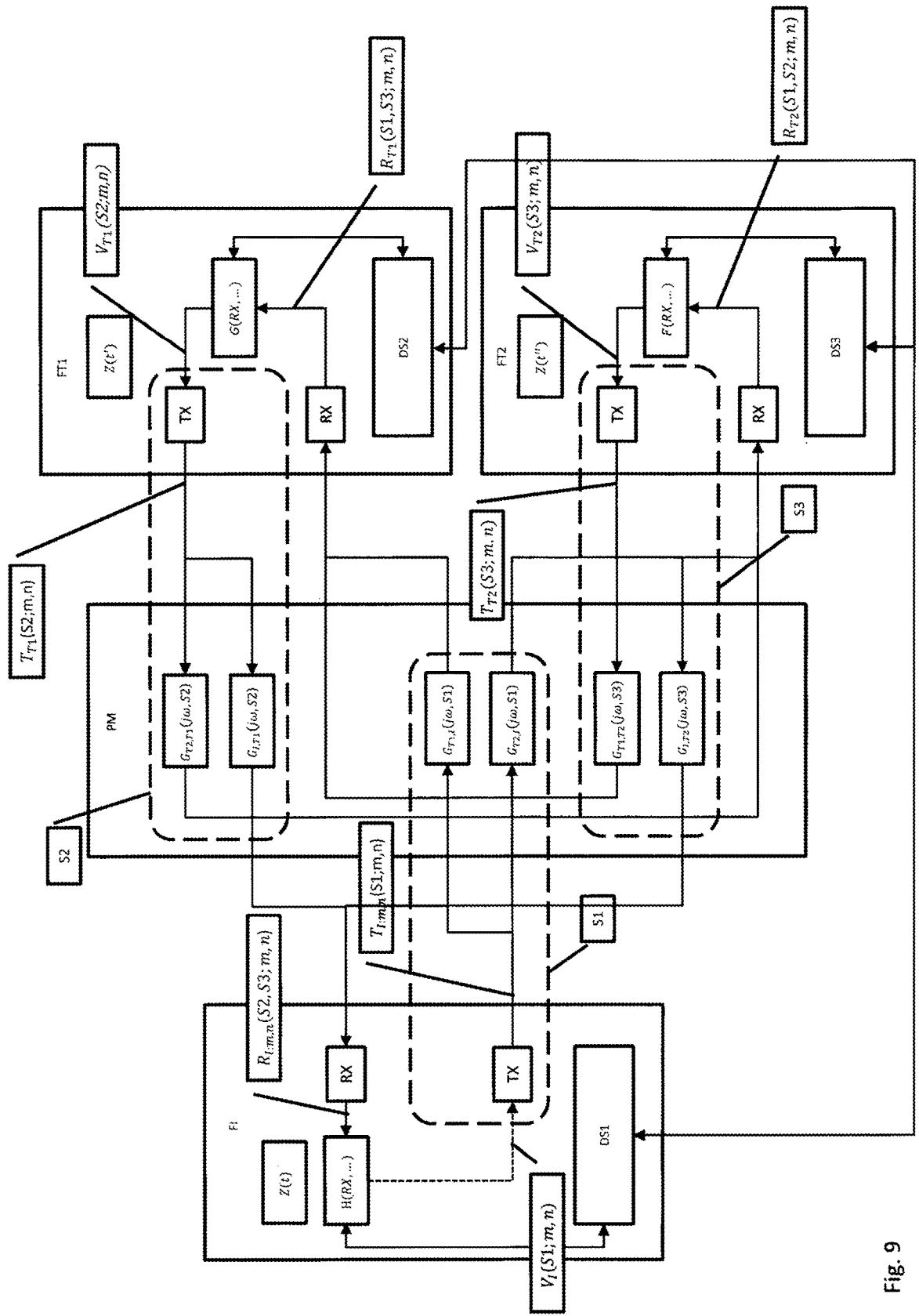
FIG. 9 shows an arrangement of three radio nodes.

The illustration in FIG. 9 shows a schematic arrangement of three radio nodes FI, FT1 and FT2 for carrying out a further alternative embodiment of the method according to the invention for radio measuring applications. Each of the three radio nodes FI, FTL and FT2 comprises a receiving unit RX, a transmitting unit TX, a data interface DSL or DS2 or DS3 and an own timer Z (t) or Z (t') or Z (t'').

Figure 10:
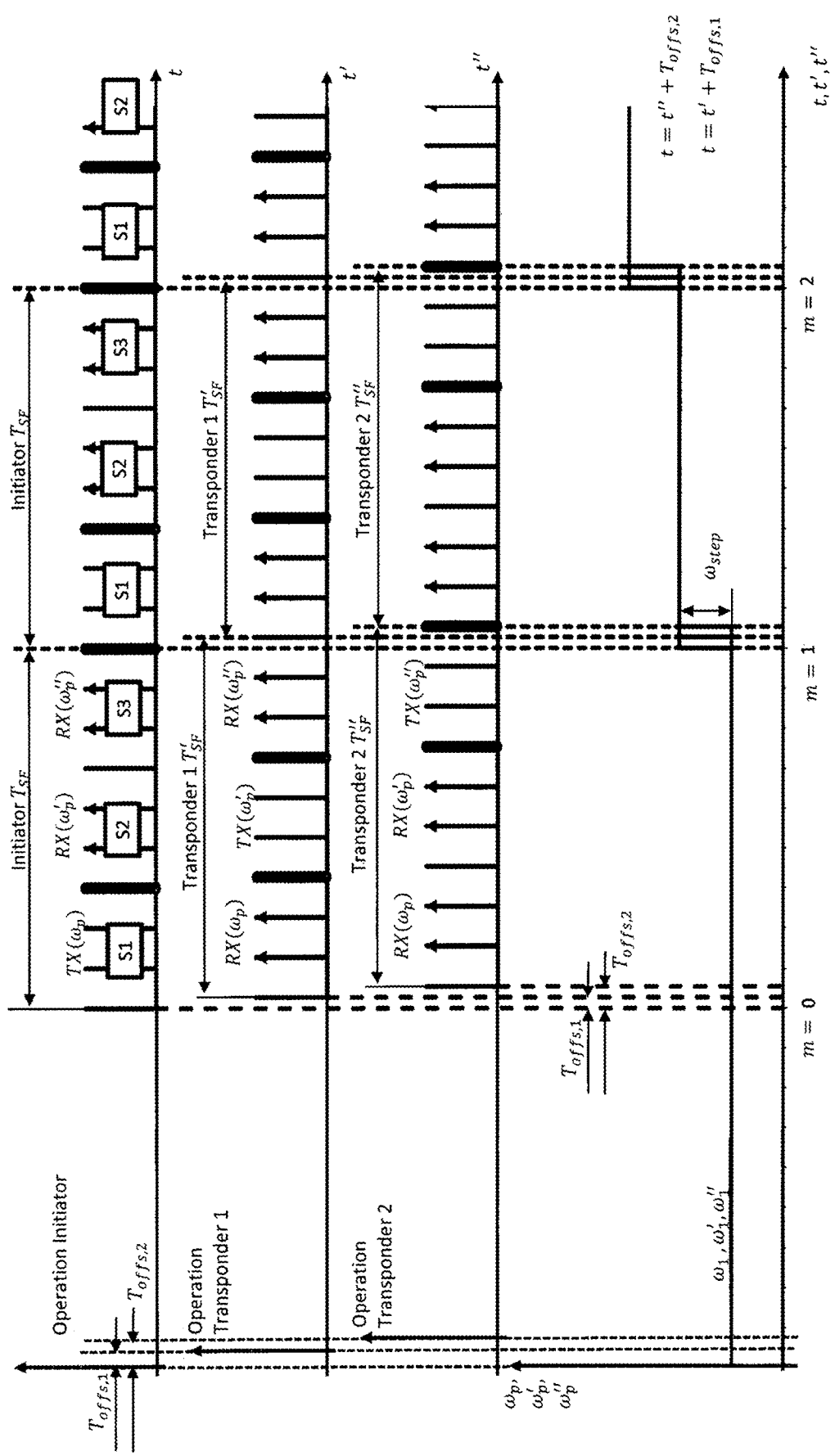
FIG. 10 is a flow chart using three radio nodes.

The illustration in FIG. 10 illustrates the process of the method according to the invention with three radio nodes on the respective time axis t or t' or t''. There is a time offset $T_{offs,1}$ or $T_{offs,2}$ between the individual time bases. A first radio node FI forms the initiator and the two further radio nodes FT1 and FT2 each form a transponder. Only the differences from the previous illustrations, in particular from FIG. 4, are explained below.

A step sequence can be formed of three steps, wherein in the first step S1, the initiator FI transmits an initial signal $T_1$ in the transmission mode, which is received by the two transponders FT1 and FT2, in the second step S2, the first transponder FT1 transmits a response signal $T_{T1}$, which is received by the initiator FI and the second transponder FT2, and in the third step S3 the second transponder FT2 transmits a response signal $T_{T2}$, which is received by the initiator FI and the first transponder FT1.

The step sequence takes up a time interval $T_{SF}$ and is repeated several times, wherein the index m indicates the repetitions. The initial signal $T_I$ and both response signals $T_{T1}$ and $T_{T2}$ are coherent at least during a step sequence, that is to say during the time interval $T_{sf}$.

The third step S3 thus corresponds to a repetition of the second step S2, except that another transponder transmits the response signal.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed:

1. A method for radio measuring applications, the method comprising:
    providing at least two radio nodes, at least one first radio node operates as an initiator and at least a second radio node as a transponder, the first radio node and the second radio node each have their own timer, signal processor, at least one antenna and a data interface;
    providing a time offset between the timers of the first radio node and the second radio node;
    transmitting by the initiator, in a first step, an initial signal with a first carrier frequency, the initial signal being received by the transponder during a first reception period,
    transmitting by the transponder, in a second step, a response signal with a second carrier frequency, the initiator receiving the response signal during a second reception period;
    repeating the first step and the second step at least once, the initial signal and the response signal being coherent at least during each step sequence;
    changing the carrier frequency of the initial signal and the carrier frequency of the response signal with each repetition within a predetermined frequency domain; and
    operating the method either in a first mode or in a second mode, wherein, in the first mode, the response signal is formed from at least a portion of the received initial signal and a transfer function and/or the time offset are determined on the basis of at least a portion of the received response signals, wherein, in the first mode, a first complex signal vector is determined by the transponder either from the initial signal and the response signal from the first complex signal vector or from the reciprocal first complex signal vector or from the conjugate complex first signal vector, or wherein a first phase is determined from the initial signal by the transponder and the response signal is formed from the first phase or the inverted first phase, and wherein, in the second mode, the response signal is formed independently of the received initial signal, at least two received initial signals are transmitted via the data interface and at least one transfer function and/or the time offsets are determined on the basis of at least portion of the received response signals and at least a portion of the received and transmitted initial signals.

2. The method according to claim 1, wherein the second carrier frequency corresponds to the first carrier frequency or differs from the first carrier frequency.

3. The method according to claim 1, wherein a measurement cycle is made up of several repetitions of the sequence of steps and the initial signal and the response signal are coherent at least during one measurement cycle or at least during a plurality of measurement cycles.

4. The method according to claim 1, wherein at least one radio node always operates as an initiator and at least one radio node always operates as a transponder, wherein each radio node operates over several step sequences at least once as an initiator and at least once as a transponder or each radio node operates over several step sequences only as an initiator or only as a transponder.

5. The method according to claim 1, wherein a measurement cycle is formed from several repetitions of the sequence of steps and the first carrier frequency for each repetition in each case assumes a predetermined value within the frequency domain during the measuring cycle.

6. The method according to claim 1, wherein on the basis of the determined transfer function and/or the time offset, an interval between the at least one initiator and the at least one transponder is determined.

7. The method according to claim 1, wherein, for at least one determined transfer function, a multipath analysis is carried out.

8. The method according to claim 1, wherein a filter is applied to the received response signals and/or the received initial signals.

9. The method according to claim 1, wherein, with each repetition, in addition to the carrier frequency of the initial signal an amplitude and/or a phase of the initial signal is changed.

10. The method according to claim 1, wherein, at least three radio nodes are provided and in each step sequence, the second step is repeated at least once, wherein in the first step the initial signal is received by at least two radio nodes operating as transponders, the response signal is sent by exactly one of the transponders in each second step and is received by the initiator and by at least one further transponder, with each repetition of the second step another transponder transmits the response signal and in the first mode, each time the second step is repeated, the response signal is formed at least from a portion of the received initial signal or from a portion of the received response signal.

11. The method according to claim 1, wherein the initiator transmits the initial signal during a first transmission period and the transponder transmits the response signal during a second transmission period, wherein the first transmission period and the second transmission period each comprise a plurality of successive time windows, in each case transmissions are made only during the time windows and in each case two successive time windows follow one another immediately in time or offset in time to each other.

* * * * *